United States Patent
Bishop

(10) Patent No.: US 6,373,757 B1
(45) Date of Patent: Apr. 16, 2002

(54) INTEGRATED CIRCUIT MEMORY DEVICES HAVING CONTROL CIRCUITS THEREIN THAT PROVIDE COLUMN REDUNDANCY CAPABILITY

(75) Inventor: Robert H. Bishop, Lawrenceville, GA (US)

(73) Assignee: Integrated Device Technology, Inc., Santa Clara, CA (US)

(*) Notice: Subject to any disclaimer, the term of this patent is extended or adjusted under 35 U.S.C. 154(b) by 91 days.

(21) Appl. No.: 09/617,155

(22) Filed: Jul. 17, 2000

(51) Int. Cl.[7] ................................................. G11C 7/00
(52) U.S. Cl. ............ 365/200; 365/230.03; 365/189.11; 365/240
(58) Field of Search ........................... 365/200, 230.03, 365/189.11, 240

(56) References Cited

U.S. PATENT DOCUMENTS

| 5,134,585 A | | 7/1992 | Murakami et al. ........... 365/200 |
|---|---|---|---|
| 5,390,150 A | | 2/1995 | Kwak et al. ................. 365/227 |
| 5,608,678 A | | 3/1997 | Lysinger ..................... 365/200 |
| 5,671,189 A | | 9/1997 | Ting et al. .................. 365/229 |
| 5,734,620 A | | 3/1998 | Seyyedy ................ 365/230.03 |
| 5,768,206 A | | 6/1998 | McClure .................. 265/225.7 |
| 5,892,719 A | | 4/1999 | Kanagawa .................. 365/200 |
| 5,920,573 A | * | 7/1999 | Dorney ...................... 371/21.2 |
| 5,923,601 A | * | 7/1999 | Wendell ..................... 365/201 |
| 5,999,463 A | | 12/1999 | Park et al. .................. 365/200 |
| 6,002,620 A | | 12/1999 | Tran et al. .................. 365/200 |
| 6,011,742 A | * | 1/2000 | Zheng ..................... 365/225.7 |
| 6,178,127 B1 | * | 1/2001 | Haraguchi .................. 365/200 |

* cited by examiner

*Primary Examiner*—Vu A. Le
*Assistant Examiner*—Juan T. Nguyen
(74) *Attorney, Agent, or Firm*—Myers Bigel Sibley & Sajovec

(57) ABSTRACT

Preferred memory devices include a first bit line within a first block of memory and a second bit line within a second block of memory. The first bit line is electrically coupled to a reference voltage signal line by a pull-up transistor that turns on in response to an active first bit line pull-up signal (e.g., /BLPU_IOn=0). The second bit line is also electrically coupled to the reference voltage signal line by a pull-up transistor that turns on in response to an active second bit line pull-up signal (e.g., /BLPU_IOn+1=0). A control circuit is provided and this control circuit is responsive to a multi-bit shift signal. The control circuit disables generation of the active first bit line pull-up signal in favor of an active second bit line pull-up signal when a value of the shift signal designates replacement of the first block of memory with the second block of memory. The control circuit may also generate signals that disconnect a first IO line associated with a defective first block of memory and substitute a second IO line associated with a functional second block of memory for the first IO line.

18 Claims, 14 Drawing Sheets

INTEGRATED CIRCUIT MEMORY DEVICES HAVING CONTROL CIRCUITS THEREIN THAT PROVIDE COLUMN REDUNDANCY CAPABILITY

FIELD OF THE INVENTION

The present invention relates to integrated circuit devices, and more particularly to integrated circuit memory devices.

BACKGROUND OF THE INVENTION

Highly integrated circuit memory devices frequently include redundant memory blocks therein that can be substituted for defective memory blocks. One conventional method of replacing a defective block of memory with a redundant block of memory utilizes a shift column redundancy scheme. In a typical shift column redundancy scheme, an input/output (IO) line corresponding to the defective block of memory is disabled, and the other IO lines associated with the other blocks of memory as well as the IO line associated with the redundant block of memory are "shifted" down and enabled as functional IO lines. Unfortunately, merely disabling an IO line associated with a defective block of memory may not entirely isolate the defective block of memory from influencing the operation of the memory device. For example, if one or more bit lines within a defective block of memory are defective as a result of processing defects, then electrical "shorts" may be present between one or more bit lines and a ground reference potential. These shorts may significantly increase the power consumption of the memory device if the defective bit lines become biased at a positive reference potential (e.g., Vdd).

To address this problem, memory devices have been designed to include fuses in the pull-up paths associated with the bit lines. For example, U.S. Pat. No. 5,390,150 to Kwak et al., entitled "Semiconductor Memory Device with Redundancy Structure Suppressing Power Consumption", describes the use of fuses to reduce power consumption requirements. U.S. Pat. No. 5,768,206 to McClure, entitled "Circuit and Method for Biasing Bit Lines", also discloses the use of a fuse to selectively disable the pull-up path associated with a pair of bit lines when the bit lines are within a defective block of memory. Unfortunately, such devices may require the use of an unnecessarily large number of fuses to provide significant power reduction. The use of a large number of fuses may also limit the integration density of a memory device. Thus, notwithstanding these attempts, there continues to be a need for more highly integrated memory devices having reduced power consumption requirements in the presence of bit line shorts and other processing errors.

SUMMARY OF THE INVENTION

Preferred memory devices of the present invention comprise a first bit line within a first block of memory and a second bit line within a second block of memory. The first bit line is electrically coupled to a reference voltage signal line (e.g., Vdd, ½Vdd) by a pull-up transistor (e.g., PMOS transistor) that turns on in response to an active first bit line pull-up signal (e.g., /BLPU__IOn=0). The second bit line is also electrically coupled to the reference voltage signal line by a pull-up transistor that turns on in response to an active second bit line pull-up signal (e.g., /BLPU__IOn+1=0). A preferred control circuit is also provided and this control circuit is responsive to a multi-bit shift signal. The control circuit disables generation of the active first bit line pull-up signal in favor of an active second bit line pull-up signal when a value of the shift signal designates replacement of the first block of memory with the second block of memory.

A preferred control circuit comprises a shift redundancy control circuit, which generates a plurality of bit line select signals (e.g., SEL and /SEL) in response to the shift signal, and a bit line pull-up control circuit that is responsive to the plurality of bit line select signals. The bit line pull-up control circuit preferably generates the inactive first bit line pull-up signal and the active second bit line pull-up signal if a value of the plurality of bit line select signals designates replacement of the first block of memory with the second block of memory. An input/output routing circuit is also provided for routing data to and from an input/output bus and multiple blocks of memory, including a redundant block. This routing circuit is electrically coupled to all the blocks of memory and is responsive to the plurality of bit line select signals. In particular, the bit line select signals are used by the routing circuit to connect a plurality of memory-side ports to a reduced number of bus-side ports. Accordingly, the same signal that can be used to disable the bit lines in a defective block of memory, can also be used to control the routing circuit and thereby isolate additional devices (e.g., column multiplexers) within a defective block of memory from the bus-side ports.

According to other aspects of preferred embodiments, the shift redundancy control circuit comprises a first plurality of NAND gates having respective first inputs that receive respective bits of the multi-bit shift signal. The redundancy control circuit may also comprise a plurality of first inverters, with each of the first inverters having an input electrically coupled to an output of a respective NAND gate in the first plurality of NAND gates and an output electrically coupled to a second input of a respective NAND gate in the first plurality of NAND gates. The bit line pull-up control circuit may also comprise a second plurality of NAND gates, with each of the second plurality of NAND gates having first and second inputs electrically coupled to the second input and the output, respectively, of a respective NAND gate in the first plurality of NAND gates. In addition, the bit line pull-up control circuit may comprise a third plurality of NAND gates, with each of the third plurality of NAND gates having a first input electrically coupled to an output of a respective NAND gate in the second plurality of NAND gates and a second input that receives a bit line pull-up bank signal (e.g., BLPUBANK). An output of one of the third plurality of NAND gates is electrically connected to bit line pull-up transistors in a respective block of memory and an output of another of the third plurality of NAND gates is electrically connected to bit line pull-up transistors in another block of memory. In this manner, the bit line pull-up control circuit can be used to disable the bit line pull-up transistors in a block of "defective" memory and thereby prevent excessive power consumption that may occur if one or more defective bit lines therein is shorted to a ground or other reference potential, for example. Conventional techniques of reducing power consumption in defective memory blocks by blowing a relatively large number of fuses connected between a power supply potential and each of a plurality of bit lines can therefore be avoided.

Preferred embodiments of the present invention may also include methods of operating an integrated circuit memory device by decoding a first signal and disabling circuitry that controls pull-up of bit lines in a first block of memory if a decoded first signal designates replacement of the first block with another block. Additional methods may also include decoding a multi-bit shift signal as a first bit line control signal having a first logic state if a first block of memory is to be replaced by a second block of memory and generating an inactive bit line pull-up signal that disposes each of the bit lines in the first block of memory in a respective floating state if the first bit line control signal is in the first logic state.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
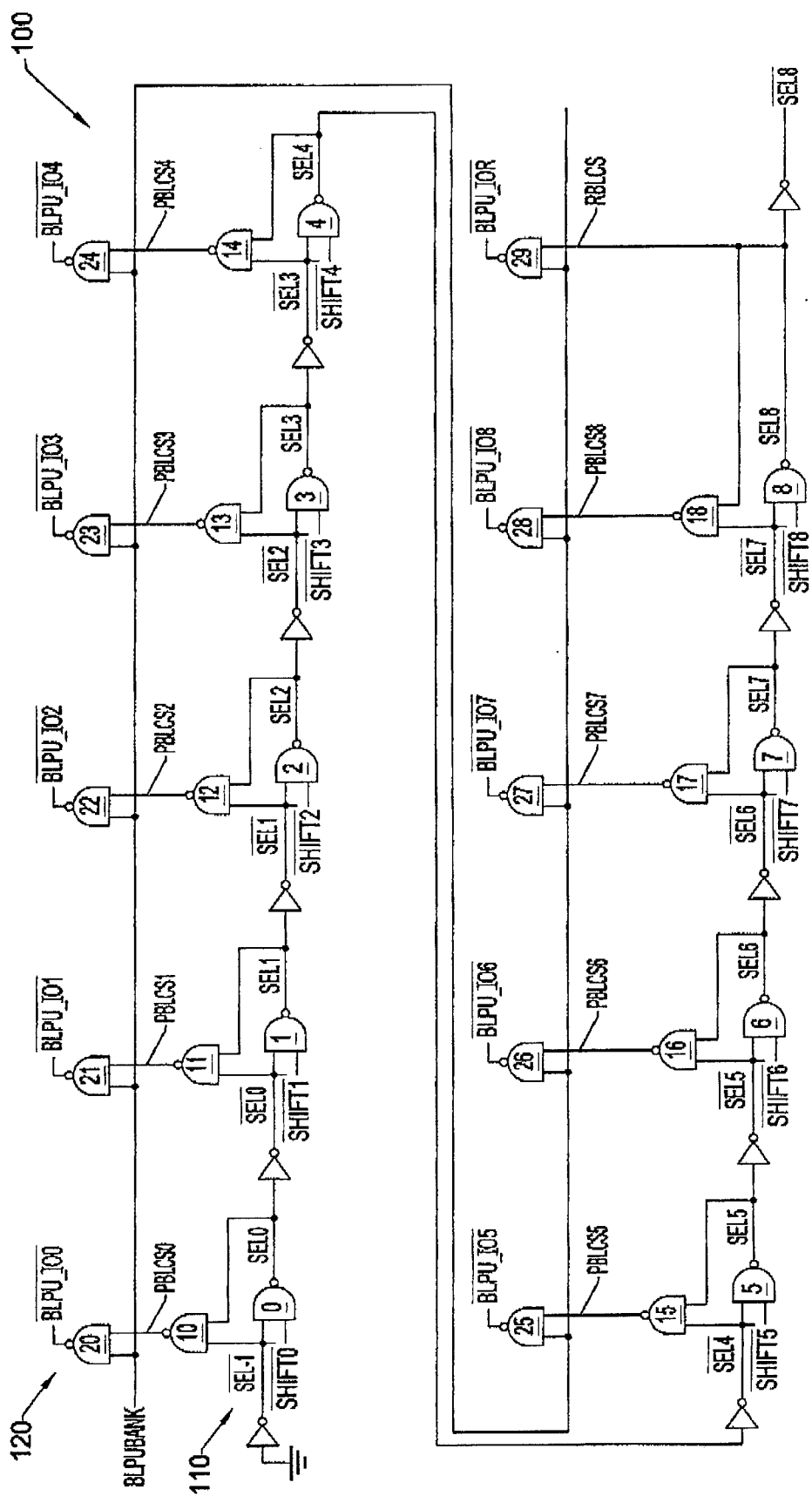
FIG. 1 is an electrical schematic of a control circuit according to a preferred embodiment of the present invention.

Referring now to FIG. 1, a preferred control circuit 100 that can replace an IO line of a defective memory block with another IO line of a functional memory block will be described. In particular, the control circuit 100 generates a multi-bit bit line pull-up signal (/BLPU_IO0 to /BLPU_IOR) in response to: (i) a bit line pull-up bank signal BLPUBANK, which may operate as a clock signal, and (ii) a multi-bit shift signal (/SHIFT0 to /SHIFT8). The control circuit 100 comprises a shift redundancy control circuit 110 that generates a plurality of true bit line select signals (SEL0 to SEL8) and a plurality of complementary bit line select signals (/SEL-1 to /SEL7). As illustrated, the shift redundancy control circuit 110 generates the true and complementary bit line select signals in response to the multi-bit shift signal (/SHIFT0–/SHIFT8). In particular, the multi-bit shift signal is provided to respective inputs of a first plurality of NAND gates NAND0–NAND8. The value of the multi-bit shift signal may be established using on-chip circuitry.

The control circuit 100 also preferably comprises a bit line pull-up control circuit 120. This pull-up control circuit 120 may use a second plurality of NAND gates NAND10–NAND18 to convert respective pairs of select signals into a multi-bit primary bit line control signal (PBLCS0–PBLCS8). The most significant true bit line select signal (i.e., SEL8) may also operate as a redundant bit line control signal RBLCS. The pull-up control circuit 120 may also use a third plurality of NAND gates NAND20–NAND29 to selectively control whether an active bit line pull-up bank signal BLPUBANK is passed as a respective logic 0 bit line pull-up signal (/BLPU_IO0 to /BLPU_IOR). In particular, the third plurality of NAND gates can be used to block the generation of a respective logic 0 bit line pull-up signal whenever a corresponding primary or redundant bit line control signal (PBLCS or RBLCS) is in a logic 0 state. Stated alternatively, the bit line pull-up bank signal BLPUBANK, which may operate as a clock signal that controls the timing of when bit lines in a memory block are pulled up to a logic 1 level, may be blocked from influencing the logic value of a particular bit line pull-up signal (/BLPU_IO0 to /BLPU_IOR) when one or more columns of memory cells associated with a particular input/output line (IO0, /IO0–IO8, /IO8) are defective.

Based on the illustrated control circuit 100 of FIG. 1, the generation of a multi-bit shift signal /SHIFT<0:8> having a value equal to (110111111) will result in the generation of a multi-bit bit line select signal SEL<0:8> having a value of (001111111) and the generation of a multi-bit complementary bit line select signal /SEL<−1:7> having a value of (111000000). Taking the boolean NAND of these generated signals will result in the generation of a multi-bit primary bit line control signal PBLSC<0:8> having the value of (110111111) and the generation of a redundant bit line control signal RBLCS having a value equal to 1. Thus, whenever the bit line pull-up bank signal BLPUBANK is driven to an active logic state (e.g., logic 1) and the multi-bit shift signal /SHIFT<0:8> is set to a value equal to (110111111), the multi-bit bit line pull-up signal /BLPU_IO0–/BLPU_IOR will be driven to a value equal to (0010000000). Based on the bit lines of FIGS. 2A–2J and the column multiplexers of FIG. 3, driving the bit line pull-up signal to the value indicated will result in the replacement of the bit lines of FIG. 2C with the bit lines of FIG. 2D. As illustrated below, the nine possible combinations of the multi-bit shift signal /SHIFT<0:8> may be used to replace each of the blocks of memory with another block of memory:

| /SHIFT<0:8> | DISABLE | SHIFT BLOCKS |
| --- | --- | --- |
| (011111111) | BLOCK 0 | R,8,7,6,5,4,3,2,1→8,7,6,5,4,3,2,1,0 |
| (101111111) | BLOCK 1 | R,8,7,6,5,4,3,2→8,7,6,5,4,3,2,1 |
| (110111111) | BLOCK 2 | R,8,7,6,5,4,3→8,7,6,5,4,3,2 |
| (111011111) | BLOCK 3 | R,8,7,6,5,4→8,7,6,5,4,3 |
| (111101111) | BLOCK 4 | R,8,7,6,5→8,7,6,5,4 |
| (111110111) | BLOCK 5 | R,8,7,6→8,7,6,5 |
| (111111011) | BLOCK 6 | R,8,7→8,7,6 |
| (111111101) | BLOCK 7 | R,8→8,7 |
| (111111110) | BLOCK 8 | R→8 |

Similar circuitry may also be used for devices having a greater number of primary input/output lines IO0, /IO0–ION, /ION, where N is an positive integer. The illustrated circuitry may also be modified to enable the replacement of two or more blocks of memory when multiple redundant blocks of memory are provided.

Figure 2A:
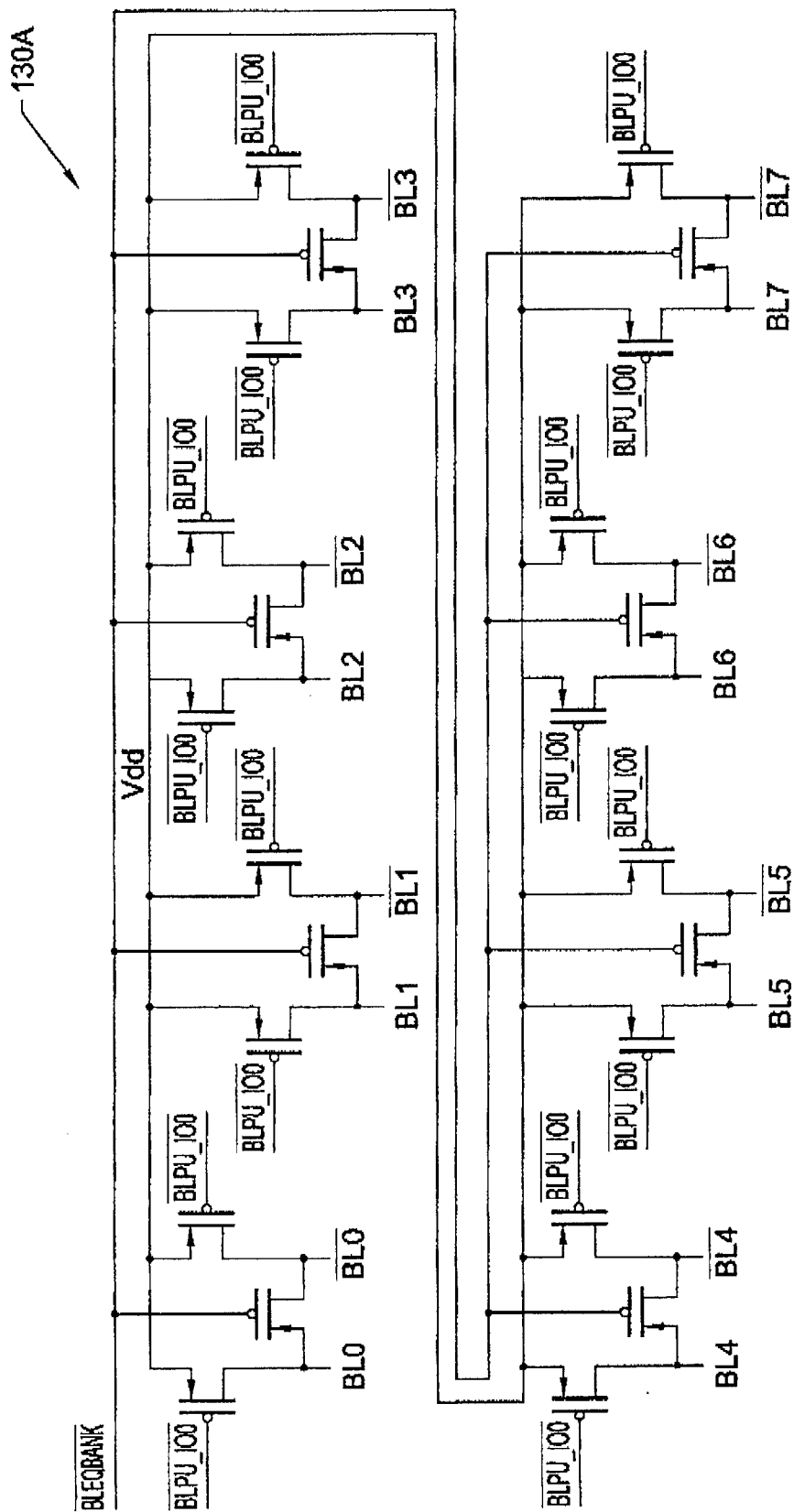
FIGS. 2A–2J are electrical schematics that illustrate pull-up and equalization circuitry associated with respective memory blocks within a preferred memory bank.
Figure 2B:
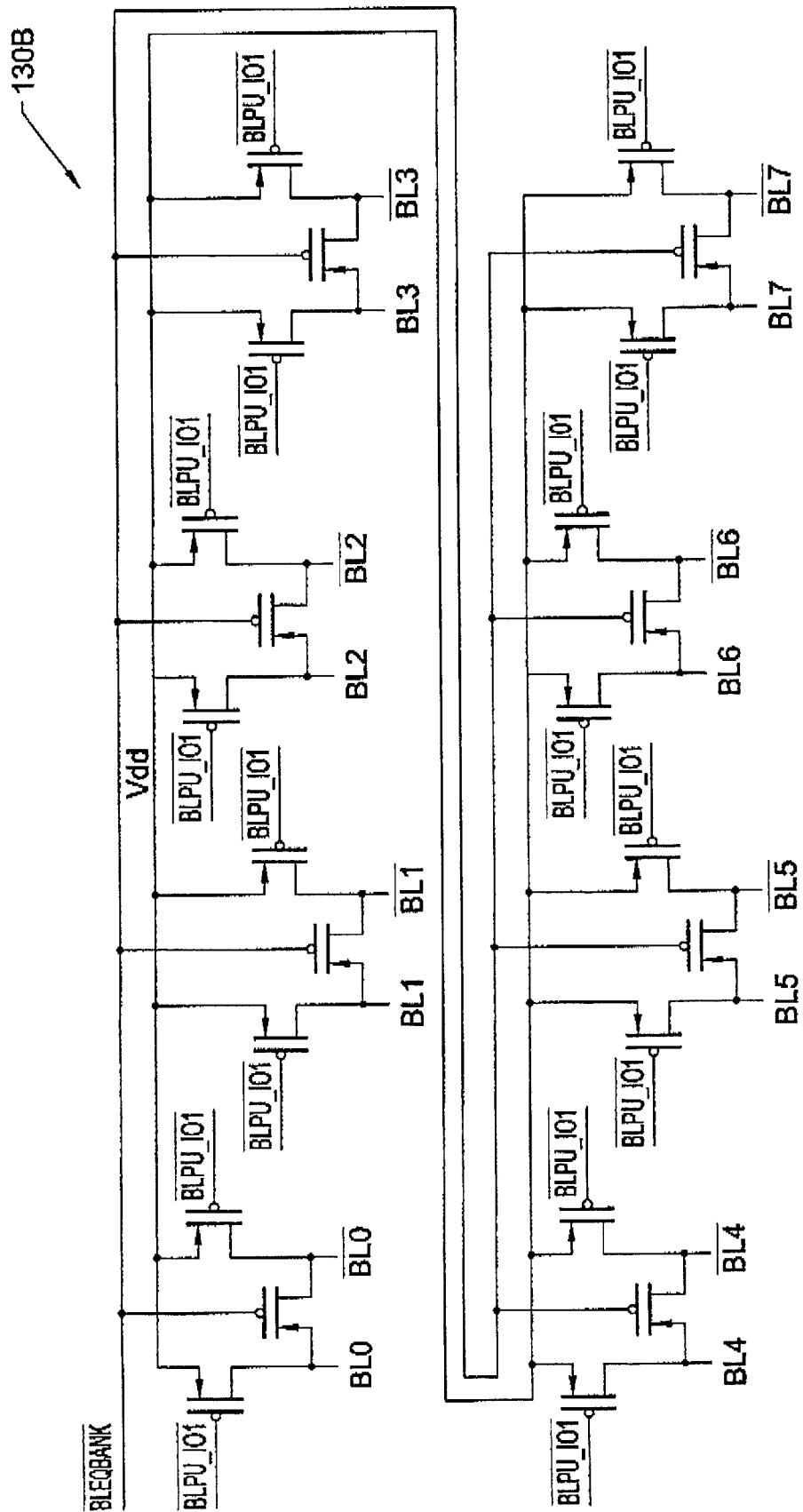
Figure 2C:
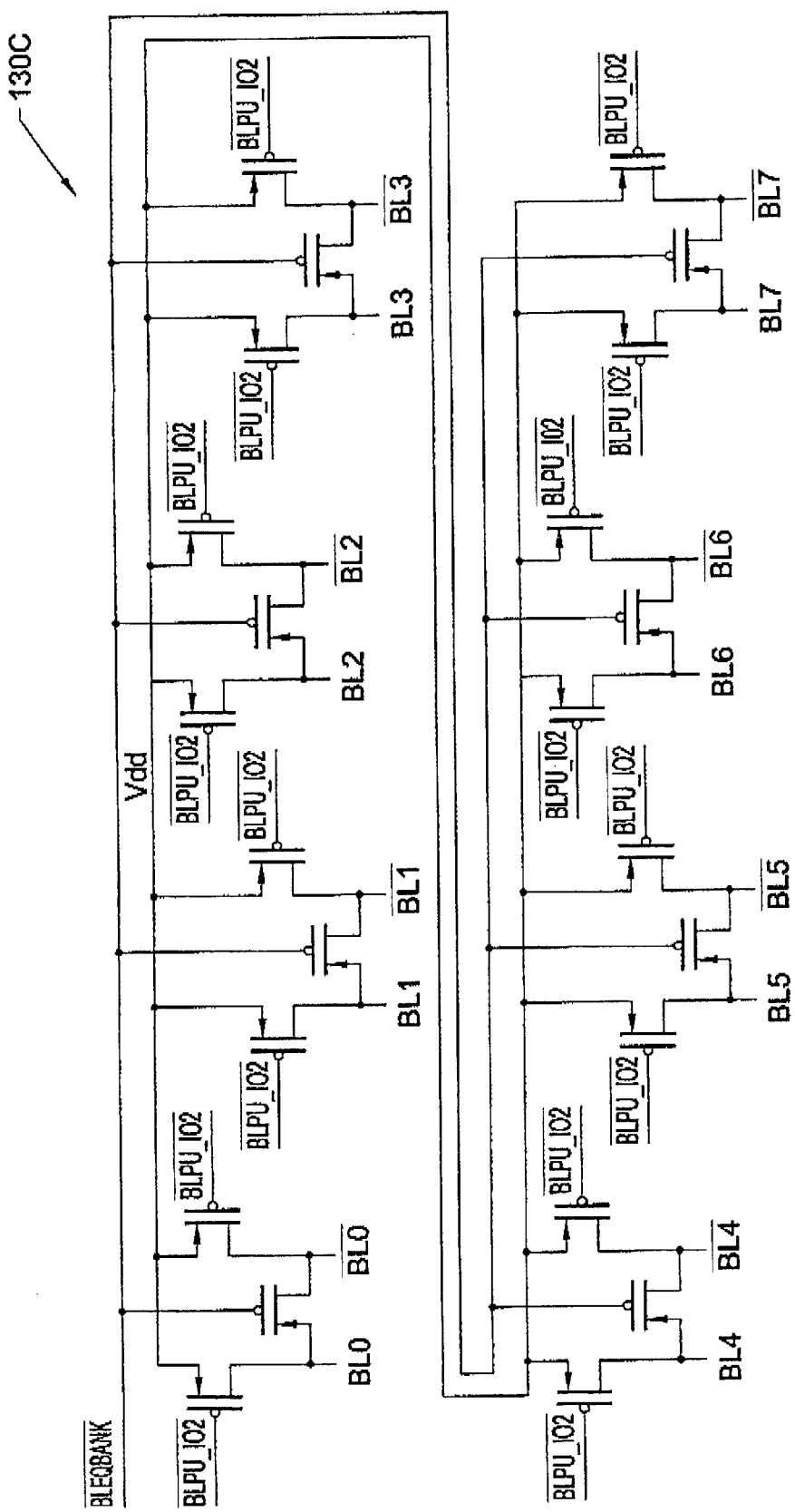
Figure 2D:
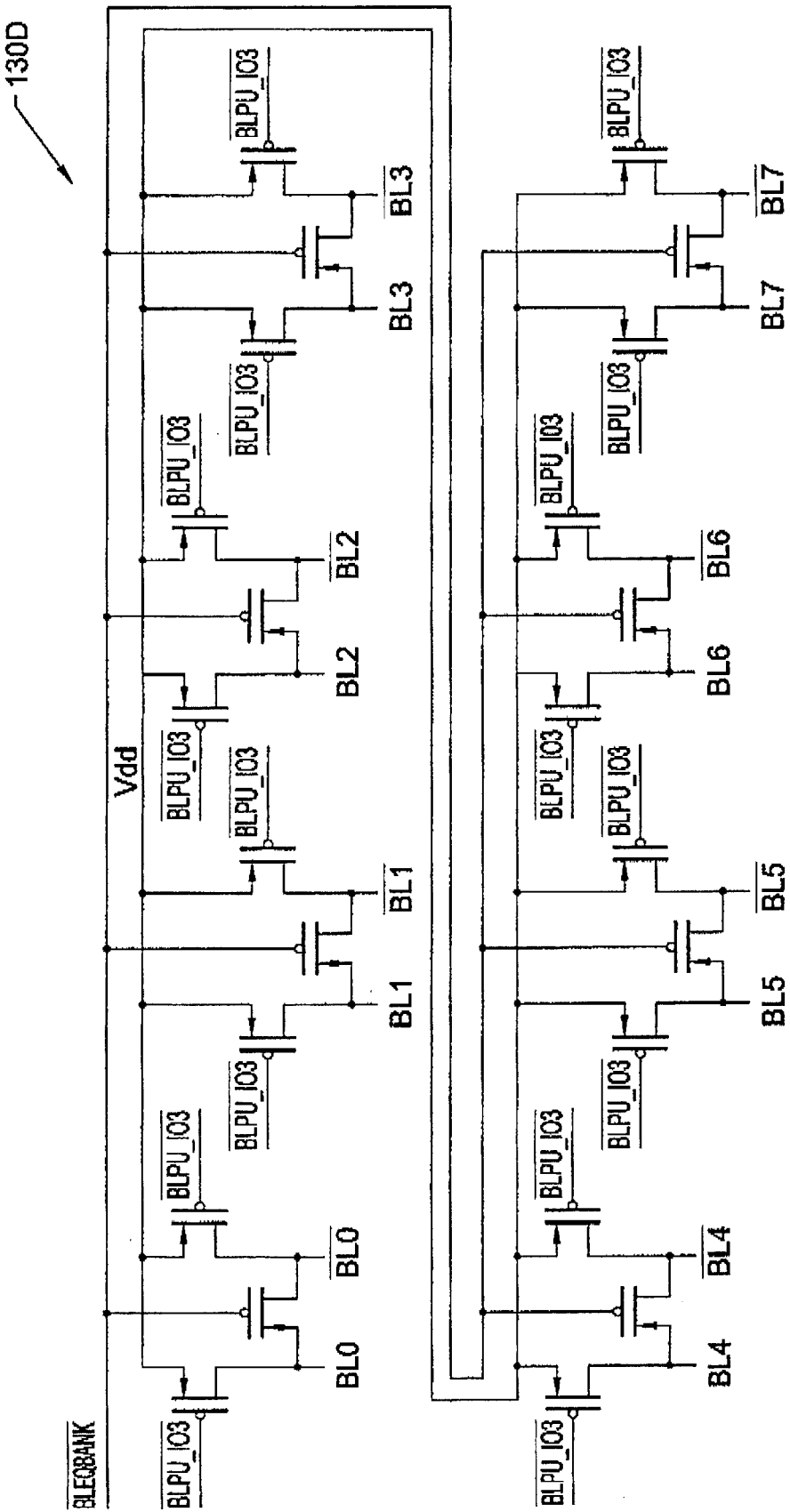
Figure 2E:
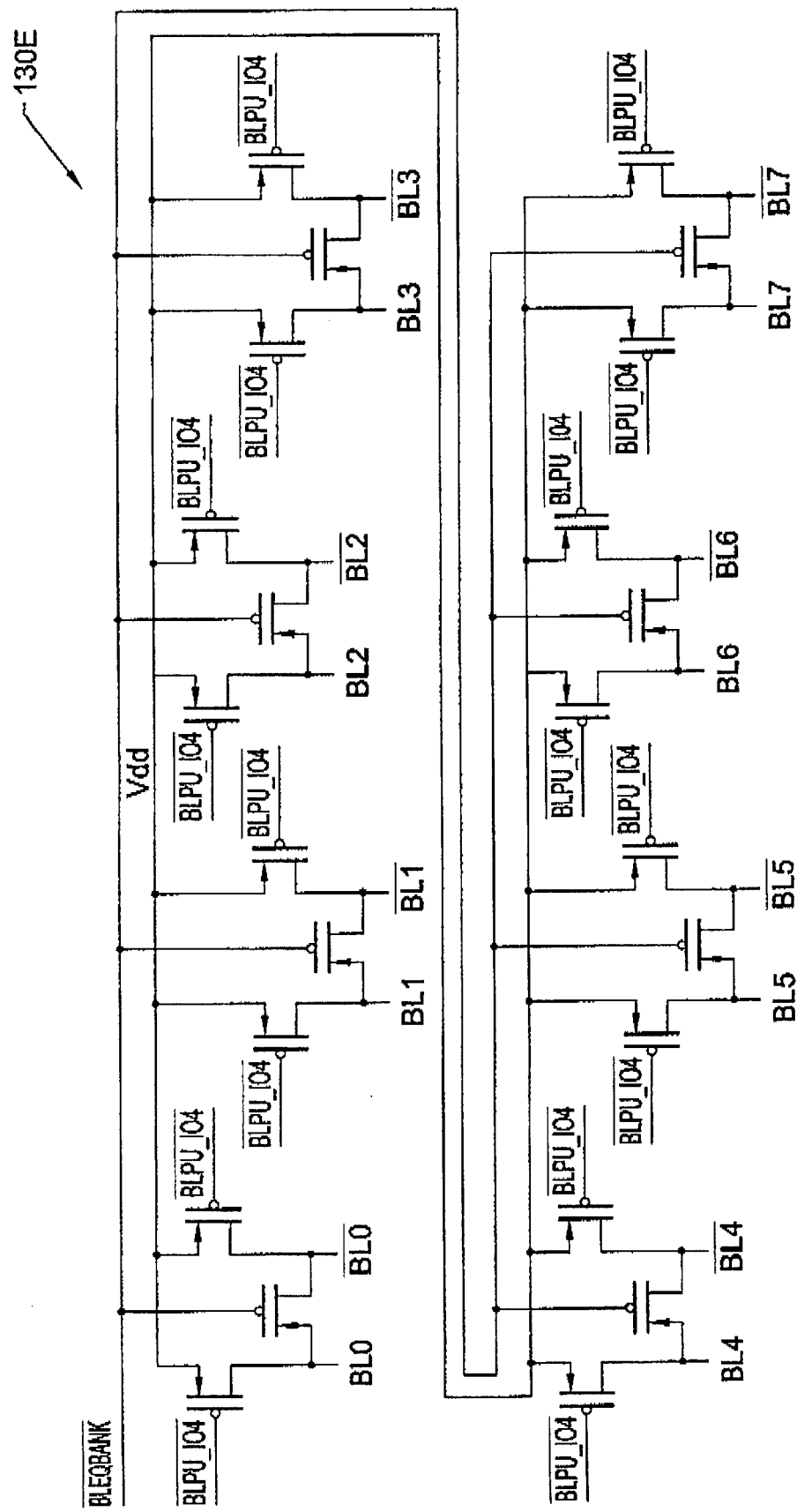
Figure 2F:
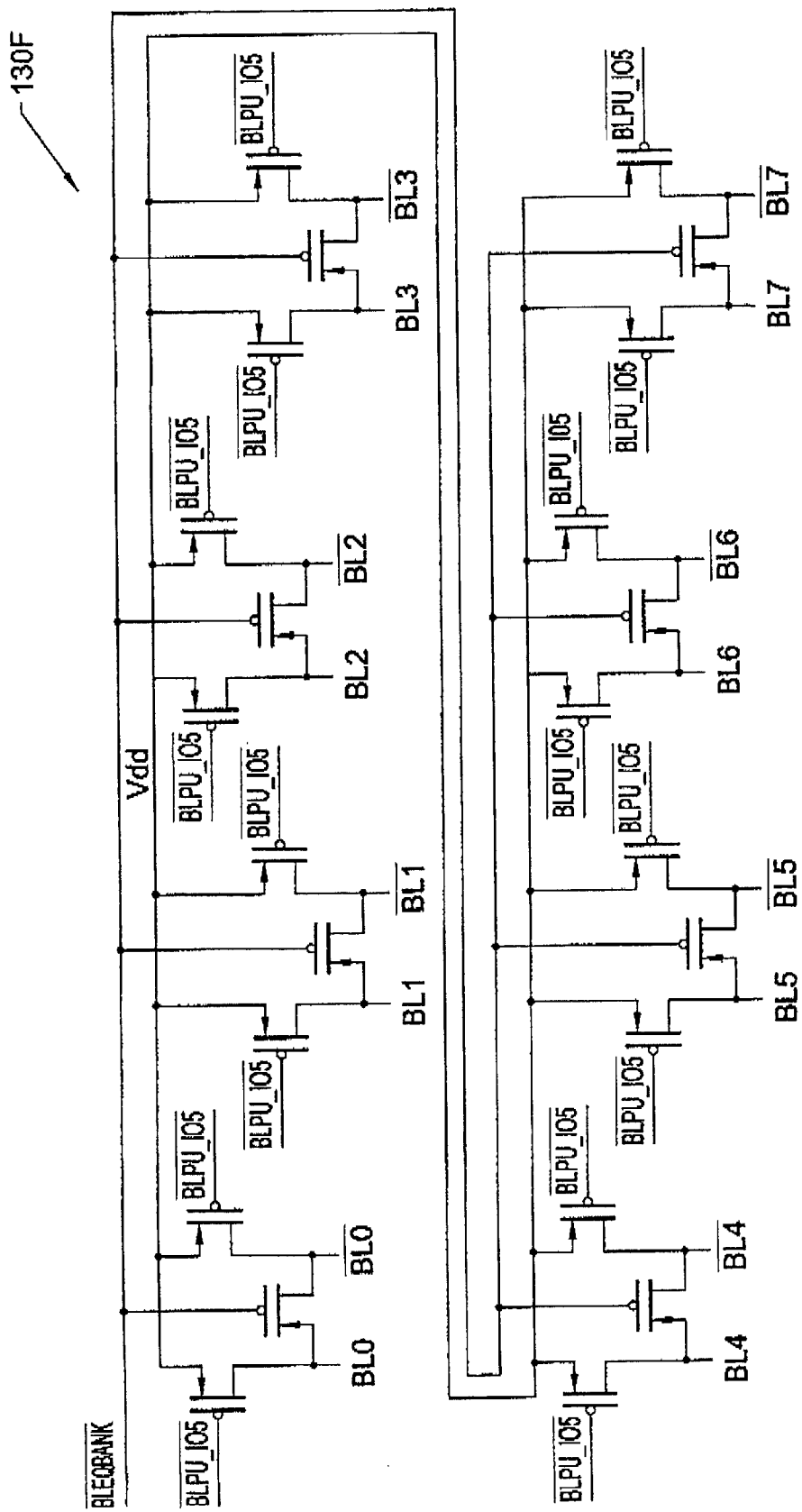
Figure 2G:
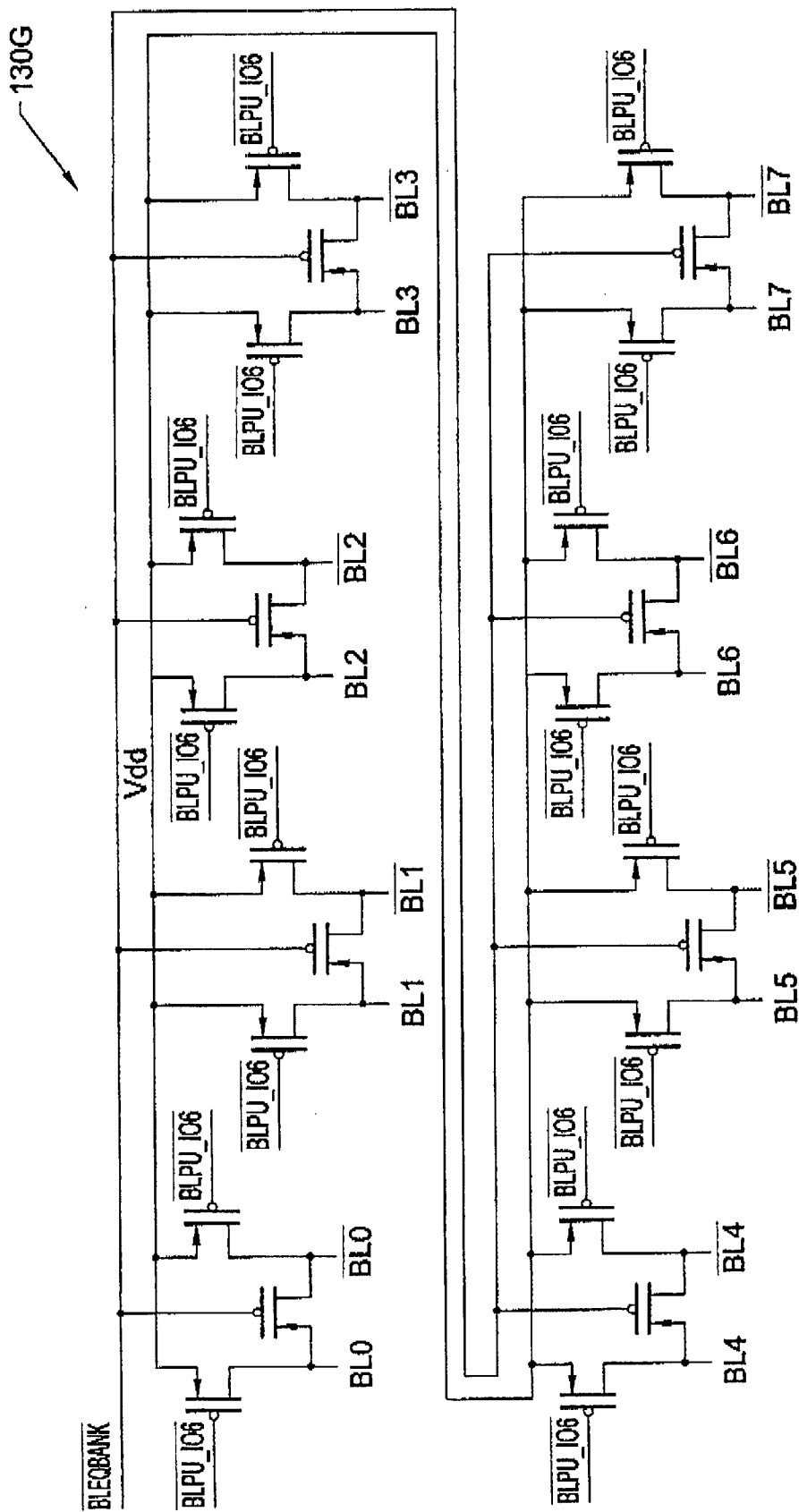
Figure 2H:
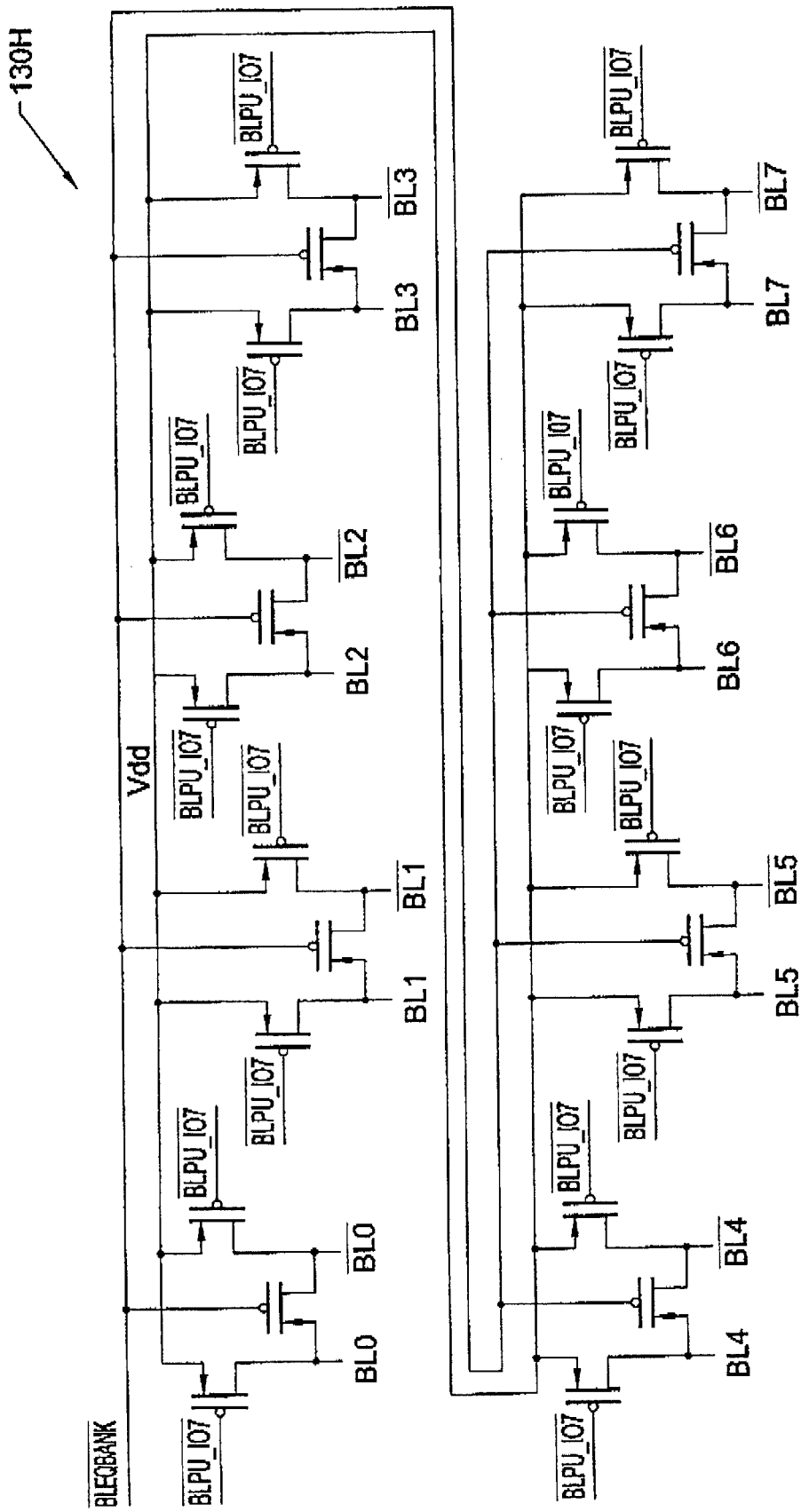
Figure 2I:
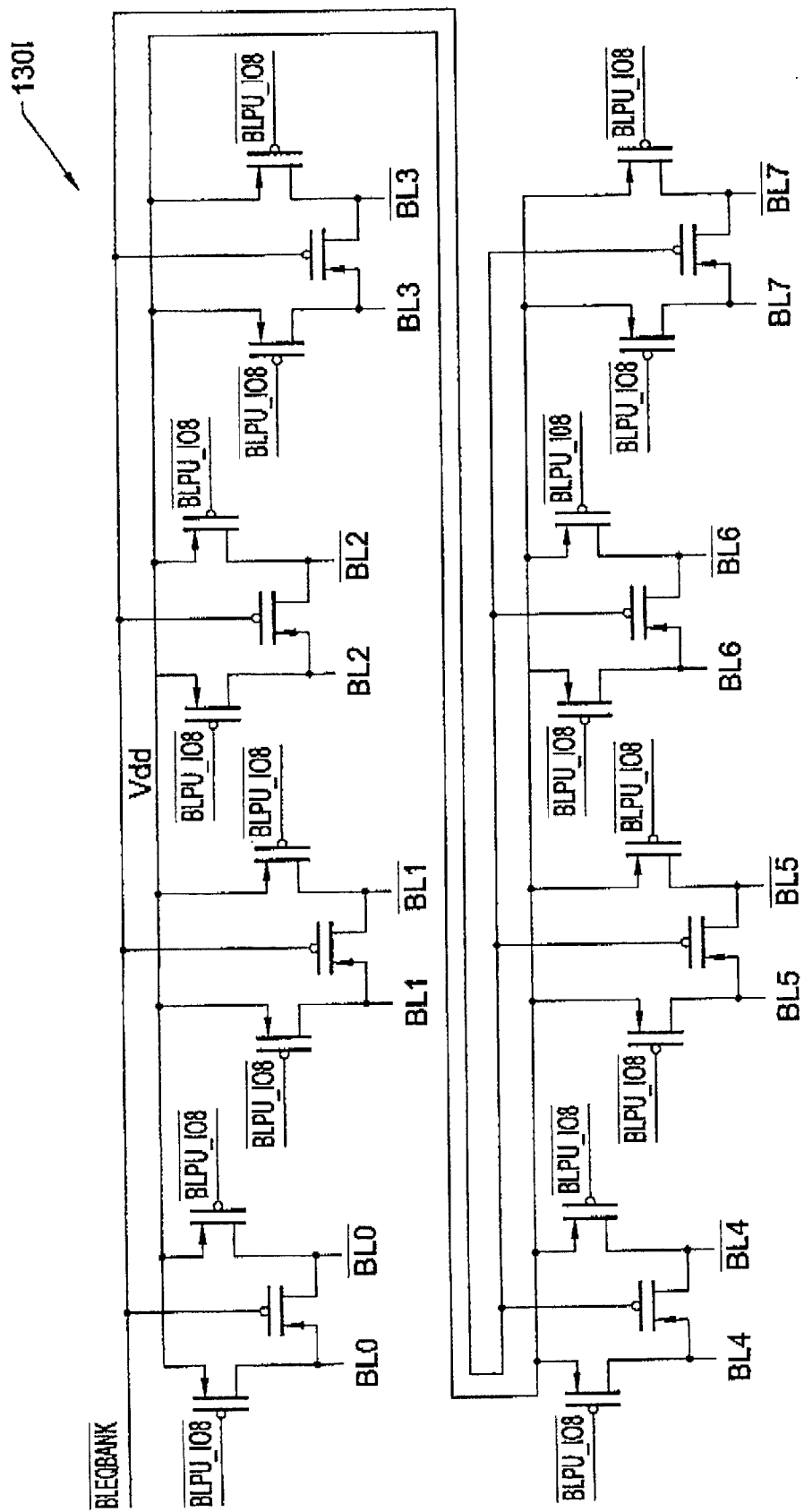
Figure 2J:
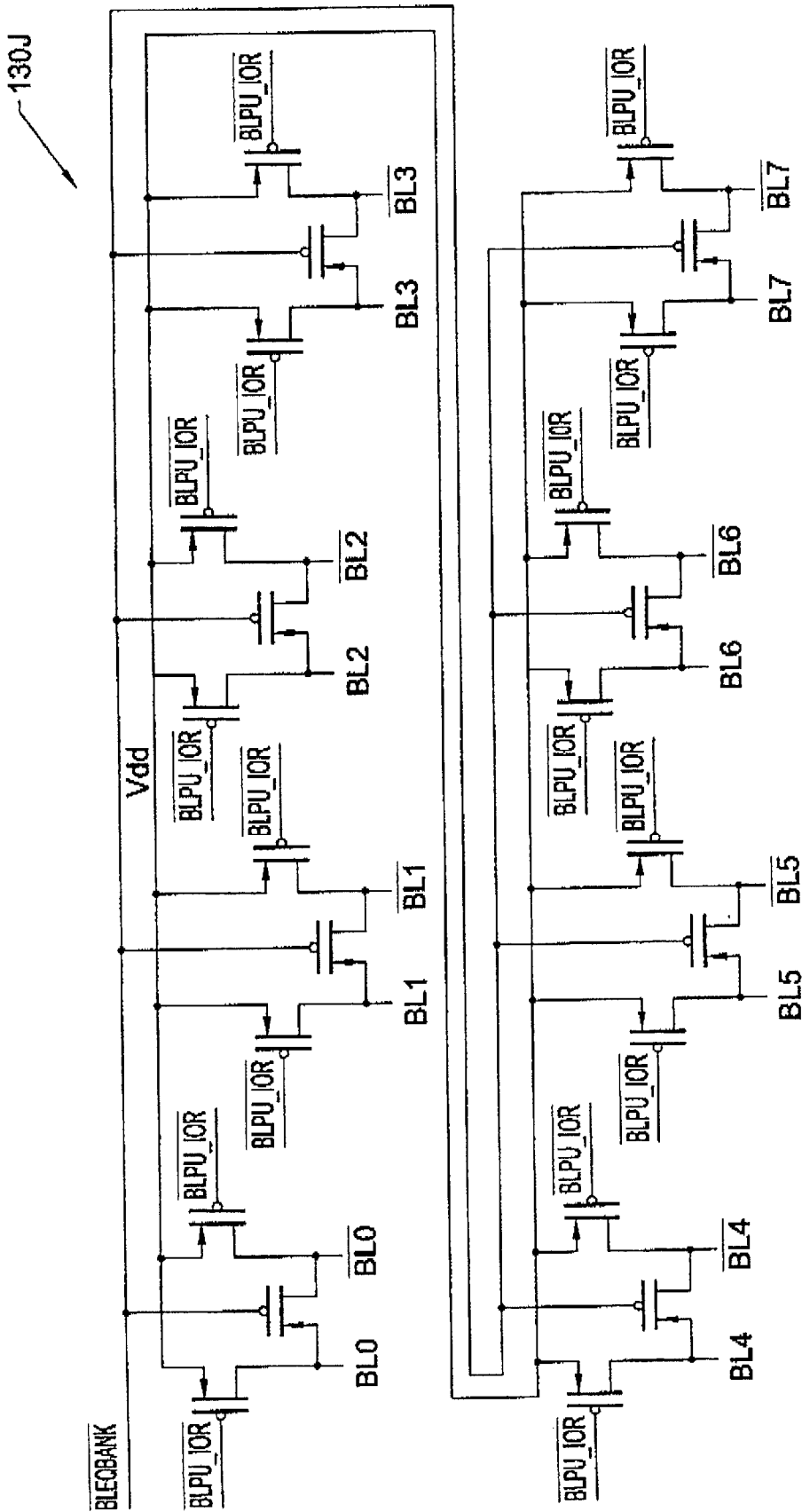
Figure 3:
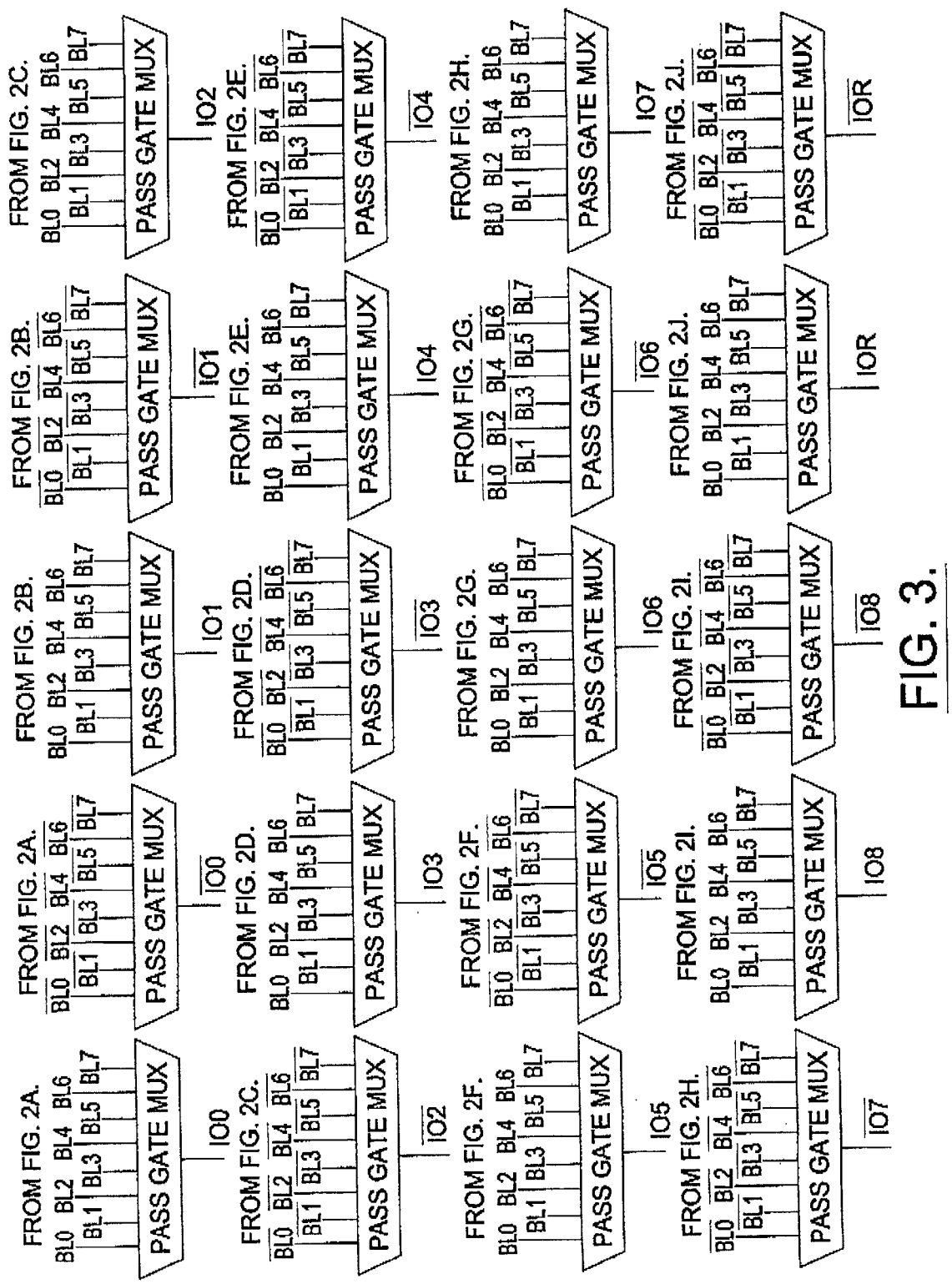
FIG. 3 is an electrical schematic illustrating an array of pass gate column multiplexers having outputs electrically coupled to respective primary and redundant input/output lines (IO0, /IO0–IOR, /IOR). These pass gate column multiplexers may comprise a plurality of PMOS transistors and may be provided in a read path.

Referring again to FIG. 2A, an electrical schematic that illustrates pull-up and equalization circuitry associated with a plurality of bit lines will be described. In particular, FIG. 2A illustrates the pull-up and equalization circuitry 130A associated with eight (8) pairs of differential bit lines BL0, /BL0–BL7, /BL7. A potential of each pair of differential bit lines can be equalized simultaneously by driving a bit line equalization bank signal /BLEQBANK to a logic 0 potential. The potential of each pair of differential bit lines can also be pulled to a reference voltage level (shown as Vdd) when the corresponding bit line pull-up signal /BLPU_IO0 is switched to a logic 0 level by the control circuit 100, as described above. These bit line equalization and pull-up operations may precede a read operation. As illustrated by FIG. 3, each of these eight pairs of differential bit lines can also be coupled by a respective "read" column MUX to a first pair of input/output lines IO0 and /IO0. Each column MUX may comprise a pass gate MUX or a MUX having drive capability (not shown) and may be responsive to a read address (not shown). A pass gate MUX in the read path may comprise a plurality of MOS transistors (e.g., PMOS). Column MUX circuitry associated with a "write" path (not shown) may also be provided using a plurality of MOS transistors (e.g., NMOS). The column MUX circuitry associated with the write path may also be responsive to a write address (not shown).

Moreover, during testing, read and write operations may be performed to detect errors in one or more memory cells or circuitry associated with each of the respective input/output lines. Based on these test operations, a decision may be made to replace one block of memory cells with another block of memory cells. Accordingly, one of the input/output lines in the group (IO0, /IO0 to IO8, /IO8) may be replaced by another input/output line in the group (IO1, /IO1 to IOR, /IOR). A relatively small number of fuses may then be set on-chip and decoded as a multi-bit shift signal (/SHIFT0–/SHIFT8) having a fixed value. The pull-up and equalization circuitry 130B–130J of FIGS. 2B–2J is similar to the circuitry of FIG. 2A, however, each of the PMOS pull-up transistors associated with a block of memory cells is responsive to a respective bit line pull-up signal in the group /BLPU_IO1, /BLPU_IO2, ... , /BLPU_IOR.

Figure 4A:
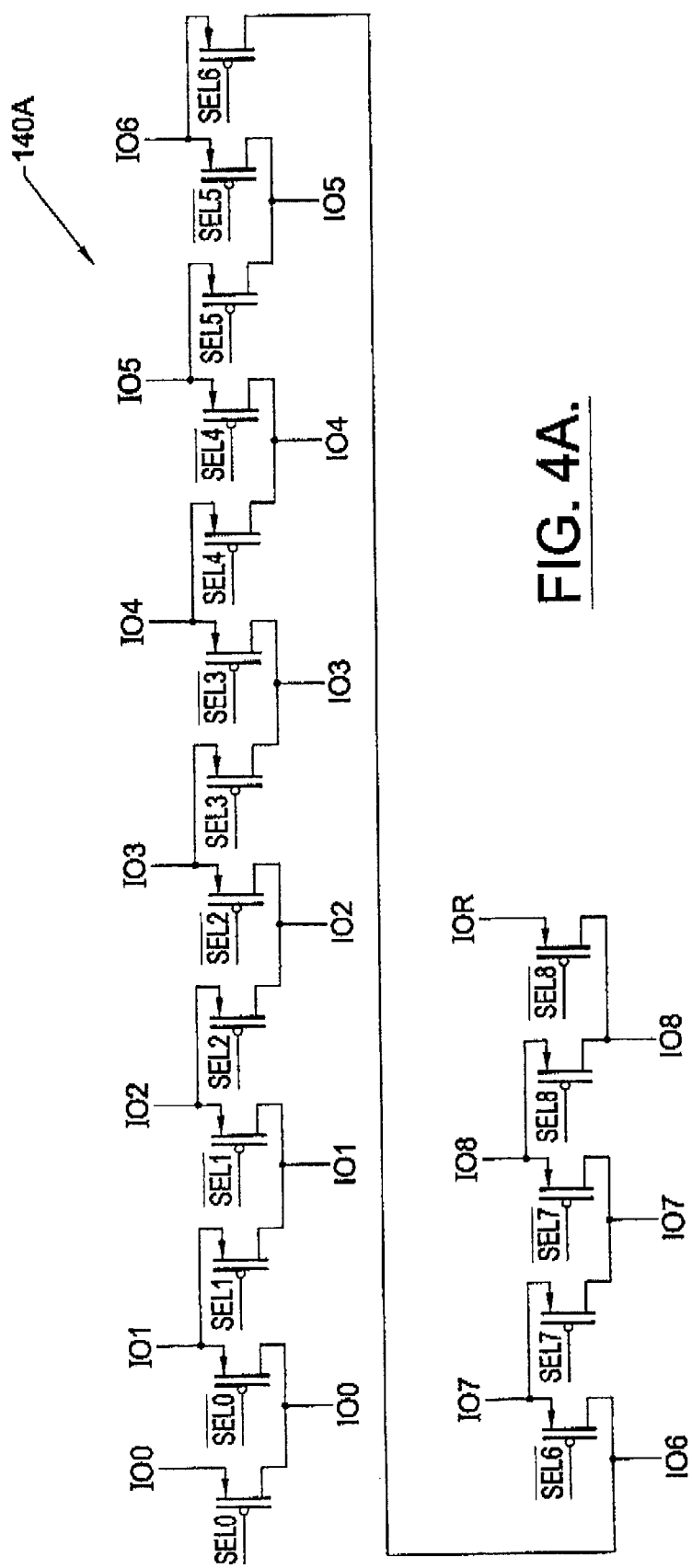
FIG. 4A is an electrical schematic of a preferred shift-IO routing circuit for true IO signals IO0–IOR. This routing circuit is responsive to the select signals (SEL0, /SEL0 to SEL8, /SEL8) of FIG. 1 and is preferably provided in the read path.
Figure 4B:
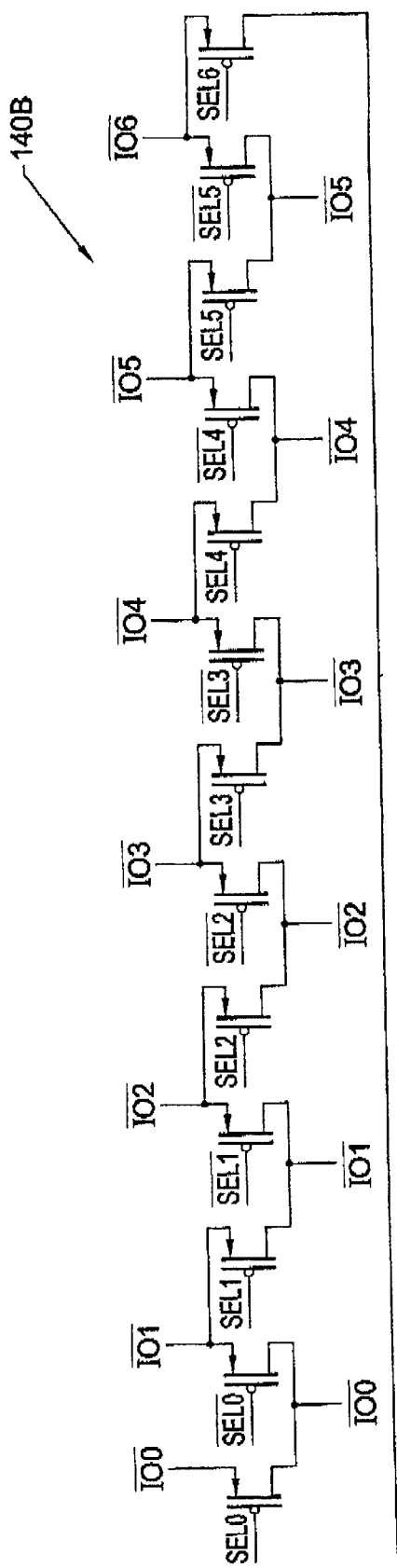
FIG. 4B is an electrical schematic of a preferred shift-IO routing circuit for complementary IO signals /IO0–/IOR. This routing circuit is responsive to the select signals (SEL0, /SEL0 to SEL8, /SEL8) of FIG. 1 and is preferably provided in the read path.
Figure 4B:
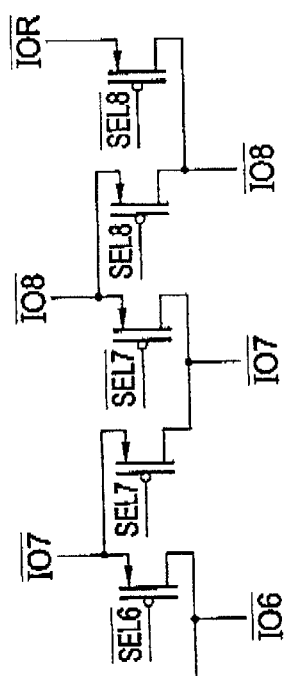

Referring now to FIGS. 4A–4B, a IO line-to-bus routing circuit 140A–140B includes a plurality of MOS transistors (e.g., PMOS) that operate as pass transistors. These pass transistors electrically couple the ten (10) pairs of illustrated outputs of the column multiplexers of FIG. 3 to nine (9) pairs of input/output lines associated with an IO bus during a read operation. These PMOS transistors operate under the control of select signals generated by the shift redundancy control circuit 110 of FIG. 1. In particular, the multi-bit bit line select signal SEL<0:8> and the multi-bit complementary bit line select signal /SEL<0:8> of FIG. 1 can be used to route nine (9) of the ten (10) pairs of input/output lines in the group (((IO0, /IO0), (IO1, /IO1), ... , (IO8, /IO8), (IOR, /IOR)) to a 9-bit wide IO bus. Similar routing circuitry and "write" multiplexers (not shown) may also be provided when writing data from the 9-bit wide IO bus to the bit lines within the active blocks of memory.

Accordingly, the routing circuit of FIGS. 4A–4B enables the replacement of a particular block of memory cells with another block of memory cells without altering the operation of the IO bus and without having to widen the IO bus to accommodate dedicated redundant input/output lines. The use of a multi-bit shift signal to control the replacement of a particular block of memory cells with another block also eliminates the need to have a respective fuse in each pull-up path extending between the illustrated PMOS pull-up transistors of FIGS. 2A–2J and the reference voltage line (shown as power supply line Vdd).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a first block of memory, said first block of memory having a bit line therein that is electrically coupled to a reference voltage signal line by a first pull-up transistor that turns on in response to an active first bit line pull-up signal;
   a second block of memory, said second block of memory having a bit line therein that is electrically coupled to the reference voltage signal line by a second pull-up transistor that turns on in response to an active second bit line pull-up signal; and
   a control circuit that is responsive to a shift signal and disables generation of the active first bit line pull-up signal in favor of the active second bit line pull-up signal when a value of the shift signal designates replacement of the first block of memory with the second block of memory.

2. The memory device of claim 1, wherein said control circuit comprises:
   a shift redundancy control circuit that generates a plurality of bit line select signals in response to the shift signal; and
   a bit line pull-up control circuit that is responsive to the plurality of bit line select signals and generates an inactive first bit line pull-up signal and the active second bit line pull-up signal if a value of the plurality of bit line select signals designates replacement of the first block of memory with the second block of memory.

3. The memory device of claim 2, further comprising:
   a routing circuit that is electrically coupled to said first block of memory and to said second block of memory and is responsive to the plurality of bit line select signals.

4. The memory device of claim 3, wherein said first block of memory and said second block of memory have a first column multiplexer and a second column multiplexer therein, respectively; and wherein said routing circuit has a first port electrically coupled to an output of said first column multiplexer and a second port electrically coupled to an output of said second column multiplexer.

5. The memory device of claim 4, wherein said routing circuit routes signals at the output of said first column multiplexer to a third port thereof when the bit line select signals designate that the first block of memory is not replaced by said second block of memory; and wherein said routing circuit routes signals at the output of said second column multiplexer to the third port when the bit line select signals designate replacement of the first block of memory with the second block of memory.

6. The memory device of claim 2, wherein the shift signal is a multi-bit signal; and wherein said shift redundancy control circuit comprises a first plurality of NAND gates having respective first inputs that receive respective bits of the multi-bit shift signal.

7. The memory device of claim 6, wherein said shift redundancy control circuit comprises a plurality of first inverters; and wherein each of the first inverters has an input electrically coupled to an output of a respective NAND gate in said first plurality of NAND gates and an output electrically coupled to a second input of a respective NAND gate in said first plurality of NAND gates.

8. The memory device of claim 7, wherein said bit line pull-up control circuit comprises a second plurality of NAND gates; and wherein each of said second plurality of NAND gates has first and second inputs electrically coupled to the second input and the output, respectively, of a respective NAND gate in said first plurality of NAND gates.

9. The memory device of claim 8, wherein said bit line pull-up control circuit comprises a third plurality of NAND gates; wherein each of said third plurality of NAND gates has a first input electrically coupled to an output of a respective NAND gate in said second plurality of NAND gates, and a second input that receives a bit line pull-up bank signal.

10. The memory device of claim 9, wherein an output of one of said third plurality of NAND gates is electrically connected to the pull-up transistor in the first block of memory; and wherein an output of another of said third plurality of NAND gates is electrically connected to the pull-up transistor in the second block of memory.

11. An integrated circuit memory device, comprising:
a plurality of first bit lines and a plurality of second bit lines;
a shift redundancy control circuit that generates a plurality of select signals in response to a multi-bit shift signal; and
a bit line pull-up control circuit that disables pull-up of said plurality of first bit lines when the plurality of select signals designate replacement of said plurality of first bit lines with said plurality of second bit lines.

12. An integrated circuit memory device, comprising:
a first block of memory having a first plurality of bit lines therein and a first plurality of bit line pull-up transistors electrically coupled to respective ones of the first plurality of bit lines;
a second block of memory having a second plurality of bit lines therein and a second plurality of bit line pull-up transistors electrically coupled to respective ones of the second plurality of bit lines; and
a control circuit that is responsive to a first control signal and disables the first plurality of bit line pull-up transistors when the first control signal has a first value and disables the second plurality of bit line pull-up transistors when the first control signal has a second value different from the first value.

13. The memory device of claim 12, wherein the first control signal comprises a multi-bit shift signal; and wherein a boolean AND of the first control signal having the first value and the first control signal having the second value equals binary zero.

14. The memory device of claim 13, wherein said control circuit comprises a shift redundancy control circuit that generates a plurality of bit line select signals in response to the multi-bit shift signal.

15. An integrated circuit memory device, comprising:
a first bit line electrically coupled to a reference voltage signal line by a first pull-up transistor having a gate electrode responsive to a first bit line pull-up signal; and
a pull-up control circuit that is responsive to a bit line pull-up bank signal and a select signal, enables turn on of the first pull-up transistor by converting an active bit line pull-up bank signal into an active first bit line pull-up signal if the select signal indicates the first bit line is within a functional block of memory, and disables turn-on of the first pull-up transistor if the select signals indicates the first bit line is within a defective block of memory by maintaining the first bit line pull-up signal in an inactive state irrespective of whether the bit line pull-up bank signal is in an active state or inactive state.

16. An integrated circuit memory device, comprising:
a memory cell array having a plurality of first bit lines and a plurality of second bit lines therein; and
a control circuit that is responsive to a bit line pull-up bank signal and a shift signal, charges the bit lines to a reference potential if the bit line pull-up bank signal is active and the shift signal designates the bit lines as functional, and disposes the first bit lines in floating states if the shift signal designates replacement of the plurality of first bit lines with the plurality of second bit lines.

17. A method of operating an integrated circuit memory device having a plurality of blocks of memory therein, comprising the steps of:
decoding a multi-bit shift signal as a first bit line control signal having a first logic state if a first block of memory is to be replaced by a second block of memory; and
generating an inactive bit line pull-up signal that disposes each of the bit lines in the first block of memory in a respective floating state if the first bit line control signal is in the first logic state.

18. A method of operating an integrated circuit memory device, comprising the step of:
replacing a first block of memory with a second block of memory by decoding a first signal and disabling circuitry that controls pull-up of bit lines in the first block of memory if the decoded first signal designates replacement of the first block with the second block.

* * * * *